United States Patent [19]
Ferrant

[11] Patent Number: 6,018,486
[45] Date of Patent: Jan. 25, 2000

[54] READING METHOD AND CIRCUIT FOR DYNAMIC MEMORY

[75] Inventor: Richard Ferrant, Berkeley, Calif.

[73] Assignee: SGS-Thomson Microelectronics S.A., Gentilly, France

[21] Appl. No.: 09/093,210

[22] Filed: Jun. 8, 1998

[30] Foreign Application Priority Data

Jun. 19, 1997 [FR] France .................................. 97 07809

[51] Int. Cl.⁷ .................................................. G11C 7/00
[52] U.S. Cl. ...................... 365/203; 365/189.07; 365/207
[58] Field of Search ..................................... 365/203, 207, 365/189.09, 210, 189.07, 189.01

[56] References Cited

U.S. PATENT DOCUMENTS

| | | | |
|---|---|---|---|
| 4,634,901 | 1/1987 | McElroy | 307/530 |
| 4,980,799 | 12/1990 | Tobita | 365/182 X |
| 5,319,589 | 6/1994 | Yamagata et al. | 365/49 |
| 5,323,349 | 6/1994 | Hamade et al. | 365/207 |
| 5,353,255 | 10/1994 | Komuro | 365/208 |
| 5,761,123 | 6/1998 | Kim et al. | 365/207 X |
| 5,898,622 | 4/1999 | Ferrant | 365/207 X |

Primary Examiner—Do Hyun Yoo
Attorney, Agent, or Firm—Allen, Dyer, Doppelt, Milbrath & Gilchrist, P.A.

[57] ABSTRACT

A method is for reading a dynamic memory and a memory implementing the method. The memory includes at least one bit line, one word line, one storage cell accessible by the bit line and the word line, and one reference line, the storage cell enabling the storage of an initial potential representing a logic information. The method includes a step for the precharging of the bit line and the reference line, to carry the potential of these lines to the level of a reference potential that is different from the initial potential stored in the storage cell and a step for the selection of the storage cell to produce a modification of the potential of the bit line and thus create an initial difference between the potentials of the bit line and the reference line. It also includes a step for discharging the bit line and the reference line and a step for the production of an output signal whose state represents values of the discharge currents.

32 Claims, 3 Drawing Sheets

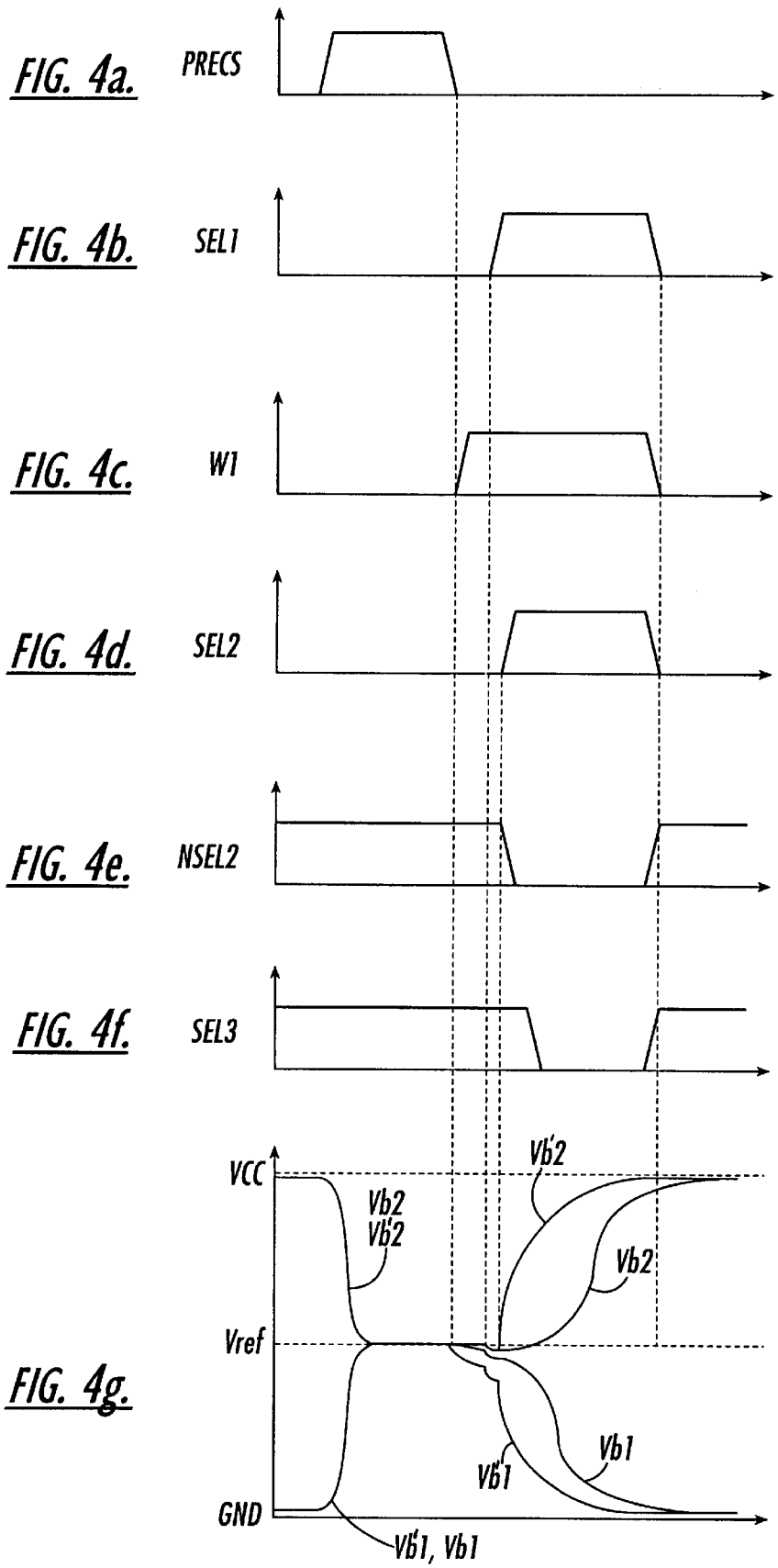

READING METHOD AND CIRCUIT FOR DYNAMIC MEMORY

FIELD OF THE INVENTION

The invention relates to integrated circuit memories and, more particularly, to the reading methods and circuits used to detect logic states stored in dynamic random-access memory cells also known as DRAMs.

BACKGROUND OF THE INVENTION

Memories are conventionally organized into matrices of storage cells. The cells of one and the same column are connected to one or more bit lines and are individually accessible by means of word lines. FIG. 1 provides a schematic view of a typical DRAM storage cell 2. This cell 2 comprises a selection transistor 4 and a storage capacitor 6.

In the example shown, the selection transistor 4 is an N channel MOS type transistor. Its control gate is connected to a word line WL and its drain is connected to a bit line BL. Its source is connected to a first terminal of the capacitor 6. This capacitor has a second terminal which receives a reference potential GND also called a ground potential. The storage cell enables the storage of a logic information element defined as a function of the voltage Vc present at the terminals of the capacitor 6, namely, in practice, as a function of the potential Vc (assuming that GND=0 V) of its first terminal.

It is generally possible to store two logic states, a high state and a low state, depending on whether the capacitor is charged or not. In the former case, the voltage Vc is, for example, equal to VCC, with VCC being a positive supply potential of the DRAM. In the latter case, Vc=GND.

Let it be assumed that the potential of the word line WL is smaller than or equal to the potential of the bit line BL. The selection transistor 4 is then off and the capacitor 6 is cut off from the bit line. To read the information stored in the cell 2, a precharging device is used to impose a reference potential Vref on the bit line. In general, the potential Vref is chosen so that it is intermediary between the values VCC and GND that can be assumed by the potential Vc. Typically, Vref is to be chosen to be equal to VCC/2. The bit line BL has a certain value of equivalent capacitance Cbl (represented in FIG. 1 by a parasitic capacitor 8) and stores the potential Vref by capacitive effect. Then, the cell 2 is selected, namely the transistor 4 is turned on by the application of an appropriate control potential to the word line WL. In practice, this selection will be made by taking the word line to the potential VCC.

A transfer of charges is then observed between the storage capacitor 6 and the parasitic capacitor 8 tending to make the voltages at the terminals of these two capacitors equal. The direction and scale of this transfer of charges are a function of the respective values of the capacitors 6 and 8 and of the voltages at their terminals. If the capacitance of the capacitor 6 is referenced Ccell and the initial voltage at its terminals is referenced Vc1, there is thus obtained at its terminals, after transfer of charges, a voltage Vc2 defined by the following relationship (assuming, to simplify matters, that the selection transistor does not cause a drop in voltage):

$$Vc2=(Cbl*Vref+Ccell*Vc1)/(Cbl+Ccell$$

If we assume that we have Vref=VCC/2 and Vc1=GND=0, then we obtain:

$$Vc2=Vc2(0)=(VCC/2)*[Ccell/(Cbl+Ccell)]$$

If we assume that Vc1=VCC, we obtain:

$$Vc2=Vc2(1)=(VCC/2)*[(Cbl+2*Ccell)/(Cbl+Ccell)]$$

In the former case, the transfer of charges is done from the bit line BL to the storage cell 2.

In the latter case, the transfer of charges is done from the storage cell 2 to the bit line BL. It is sufficient to use a comparator receiving Vc2 and Vref=VCC/2 (this potential VCC/2 being present for example on a bit line used as a reference) to obtain a logic read signal whose state represents the information initially stored in the cell 2.

If we write DV(0)=(VCC/2)−Vc2(0) and DV(1)=Vc2(1)−(VCC/2), we have DV(0)=DV(1)=DV=Ccell*(VCC/2)/(Ccell+Cbl).

Since the voltage at the terminals of the capacitor of the storage cell is modified when it is read, the reading of a cell includes a final step, known as a refresh step, to restore the initial voltage at the terminals of the storage capacitor. If this were not the case, the difference between the values of the potential Vc representing the logic states would tend to diminish, to the point of making the result of the read operation uncertain.

The DRAMs are generally associated with processors and used as buffer memories. An essential characteristic of these memories therefore is their speed. The reading will be faster for a lower value of the storage capacitor 6. Typically, capacitors with values in the range of about one-tenth of a picofarad are used. This magnitude raises a problem inasmuch as the variation in potential on the terminals of this capacitor by transfer of charges becomes lower as the value of the storage capacitor is reduced. To obtain a read signal which nevertheless can be interpreted and avoid reading errors, it is necessary to ensure a minimum potential difference between Vc2 and the reference potential VCC/2. It will be attempted, for example, to ensure Vc2(0)<0.9*VCC/2 and Vc2(1)>1.1*VCC/2. This represents a minimum margin of variation of the potential Vc2 plus or minus 10% with respect to the reference signal. This represents, for VCC=3 volts, a potential difference DV of 150 millivolts at the inputs of the comparator producing the read signal. This represents a practical lower limit.

It is furthermore preferable not to have an excessively large margin for the greater this margin, the lower the reading speed. Indeed, the duration needed for the transfer of charges between the bit line and the storage cell becomes smaller as the planned margin is made small. If it is assumed that the potential VCC is fixed, then a margin of plus or minus 10% entails an assumption, in practice, that Cbl=10*Ccell, namely about one picofarad.

One problem raised by DRAMs is, in practice, that of making a memory that is both fast and provides for a sufficient reading margin. The greater the capacity Cbl, the smaller is the variation of DV as a function of the state stored.

One approach is to increase the value of Ccell, thus making it possible to increase DV. However, this approach entails penalties for the memory in terms of speed. Furthermore, for a given technology, this requires the use of bulkier capacitors, which entails penalties in terms of integration. A transfer towards a smaller, minimum definition technology would, in addition, require a redefinition of the storage capacitors. Failing this, the simple transposition of a capacitor structure would result indeed in a reduction of the value of the capacitors and a reduced reading margin.

Another approach is to limit the value of Cbl. To do this, it is possible to limit the length of the bit lines and, therefore, the number of cells accessible per bit line. It is then necessary, if it is sought to obtain a large memory capacity, to greatly increase the number of bit lines. However, it is generally sought to limit the surface occupied by the circuits to minimize their costs and consumption.

Another approach to increasing the value of DV is to increase the value of the supply potential VCC. A problem then arises when it is sought to make circuits capable of working at low voltage, for example with VCC=3 volts or even less. The reduction of VCC indeed leads to a reduction of the reading margin.

If we assume that it is possible to find a technique by which it is possible to reconcile speed and sufficient reading margin, another problem arises if it is desired to increase the integration of the circuits by using a smaller minimum definition technology. Indeed, the threshold voltages of the transistors, and the offset voltages that result therefrom, tend to increase. As we have seen above, it is difficult to combine the speed of the memory with a sufficient reading margin. There is a risk, if the technology is changed, of having to modify the read comparator, and the read margin becomes excessively small in relation to the capacities of the comparator. This problem is also increased, as we have seen, because a simple transposition results in a reduction of the value of Ccell. This entails penalties in terms of reading margin for equivalent values of Cbl.

SUMMARY OF THE INVENTION

It is an object of the invention to provide an improved method and device for the reading of memories that make it possible to use storage capacitors of lower value, thus enabling an increase in speed while ensuring a sufficient reading margin. It is then possible to increase the integration of the memories and minimize the problems related to the transfer of manufacture towards a lower minimum definition technology.

Another object of the invention is to provide a device and method of reading by which it is possible to increase the value of the equivalent capacitance of the bit lines while ensuring a sufficient read margin, thus making it possible to obtain greater integration.

Another object of the invention is to provide a device and method of reading that can be used to obtain a memory that is capable of working at a low supply voltage, while ensuring a sufficient reading margin.

Another object of the invention is to provide a device and method of reading by which it is possible to minimize the problems of increase in offset voltage and reduction of reading margin when it is desired to transfer production to a technology with a lower minimum definition.

The invention replaces the standard reading of cells, using the measurement of variations of potential by means of a comparator, by a reading method that comprises an operation for the discharging of the bit lines and reference lines. The variation of the potentials between the bit lines and the reference lines is no longer used directly, but instead is used to modulate the values of the discharge currents of these lines. Using differentiated discharges, it is possible to amplify the difference in potential initially created between the bit lines and the reference lines when the cell read is connected to the bit line. This makes it possible to accelerate the reading operation.

The invention therefore makes it possible to minimize the influence of the values of the storage capacitors and of the bit line capacitance values. It is possible, therefore, to consider increasing the size of the bit lines, making it possible to obtain greater integration density. It also becomes easier to make circuits working at low supply voltages. Furthermore, the influence of the offset voltages which penalizes reading is minimized. It is then easier to make a change in technology by reducing the minimum feature definition.

Thus, the invention relates to a method for the reading of a dynamic memory comprising at least one bit line, one word line, one storage cell accessible by means of the bit line and the word line, and one reference line, the storage cell enabling the storage of an initial potential representing a logic information. The method comprises a step for the precharging of the bit line and the reference line, to carry the potential of these lines to the level of a reference potential that is different from the initial potential stored in the storage cell. The method also includes a step for the selection of the storage cell to produce a modification of the potential of the bit line and thus create an initial difference between the potentials of the bit line and the reference line. Further, the method includes a step for the discharging of the bit line and the reference line, the lines being then crossed by discharge currents, and a step for the production of an output signal whose state represents values of the discharge currents.

According to one embodiment, the values of the discharge currents are controlled as a function of the values of the potentials of the bit line and the reference line, in a direction tending to increase the initial difference between the values of the potentials.

According to one embodiment, the discharge currents of the bit line and the reference line are converted into a first secondary potential and a second secondary potential whose values represent respective values of the potentials of the bit line and of the reference line. The secondary potentials are compared to produce the output signal.

According to one embodiment, the method comprises a step for the amplification of the values of the first secondary potential and the second secondary potential.

According to one embodiment, the secondary potentials control an increase in the values of the discharge currents so as to amplify the difference in potential between the bit line and the reference line.

According to one embodiment, the memory being supplied by a supply potential and by a reference potential, the amplification of the secondary potentials is obtained by bringing one of the secondary potentials to the level of the supply potential and the other secondary potential to the level of the reference potential.

According to one embodiment, the initial value of the potential stored in the storage cell is substantially equal to the value of the supply potential or to the value of the reference potential. The method comprises a step for the restoration of the initial value of this stored potential when this initial value is substantially equal to the value of the supply potential. The step of restoration is initiated by the amplification of the first secondary potential and is finished by taking the value of the potential of the bit line to the value of the supply potential.

The invention also relates to a dynamic memory comprising at least one bit line and one word line, and at least one storage cell to store an initial potential representing a logic information element. The cell is accessible by means of the bit line and the word line. The memory also includes at least one reference line, this reference line possibly being a second bit line, means to precharge the bit line and the reference line so as to bring their potential to a reference value during a precharging phase, and reading means for the production, during a reading phase, of an output signal representing the initial potential stored in the storage cell. The memory further comprises means to discharge the bit lines and reference lines during the reading phase. The bit lines and reference lines being then crossed by a first discharge current and a second discharge current and the output signal representing values of discharge currents.

According to one embodiment, the memory comprises means to control the values of the discharge currents as a function of the values of the potentials of the bit line and reference line in a direction tending to increase an initial difference between the values of the potentials.

According to one embodiment, the memory comprises firstly means to convert the discharge current of the bit line into a first secondary potential and to convert the discharge current passing through the reference line into a second secondary potential. The memory also includes a comparator for receiving the secondary potentials and producing the output logic signal.

According to one embodiment, the memory comprises a current-voltage conversion circuit. This circuit comprises a first arm with two first transistors series-connected with the bit line. A first of these transistors, called a selection transistor, is used to activate the discharging of the bit line and a second of these transistors, called a conversion transistor, produces the first secondary potential when the selection transistor of the first arm is on. It also comprises a second arm comprising two second transistors series-connected with the reference line. A first of these transistors, called a selection transistor, is used to activate the discharging of the reference line and a second of these transistors, called a conversion transistor, produces the second secondary potential when the selection transistor of the second arm is on.

According to one embodiment, for each arm of the current-voltage conversion circuit, the conversion transistor has its control gate connected to the drain of the conversion transistor of the other arm so that a modification of the potential appearing at the bit line during a transfer of charges between the storage cell and the bit line induces a modification of the resistivity of the conversion transistor of the second arm. This, therefore, induces a modification in an opposite direction of the resistivity of the conversion transistor of the first arm.

According to one embodiment, the memory comprises a first read circuit to amplify a potential difference between the secondary potentials, by reducing the value of one of these potentials.

According to one embodiment, the memory comprises a second read circuit to amplify a potential difference between the secondary potentials, in increasing the value of one of these potentials.

According to one embodiment where the memory is supplied by a supply potential and by a reference potential, the initial value of the potential stored in the storage cell is substantially equal to the value of the supply potential or the value of the reference potential, and the reading phase comprises a step for the restoration of the initial value of the potential stored when this initial value is substantially equal to the value of the supply potential. The restoration of the initial value is achieved by the second read circuit through the selection transistor of the first arm of the conversion circuit. The memory comprises a complementary precharging circuit to take the value of the potential of the bit line to the level of the value of the supply potential and to finish this step of restoration.

BRIEF DESCRIPTION OF THE DRAWINGS

Other advantages and features shall appear from the following description of an exemplary embodiment of the invention together with the appended drawings, of which:

FIGS. 4a to 4g illustrate timing diagrams of control and potential signals with reference to the device of FIG. 3.

DETAILED DESCRIPTION OF THE PREFERRED EMBODIMENTS

Figure 2:
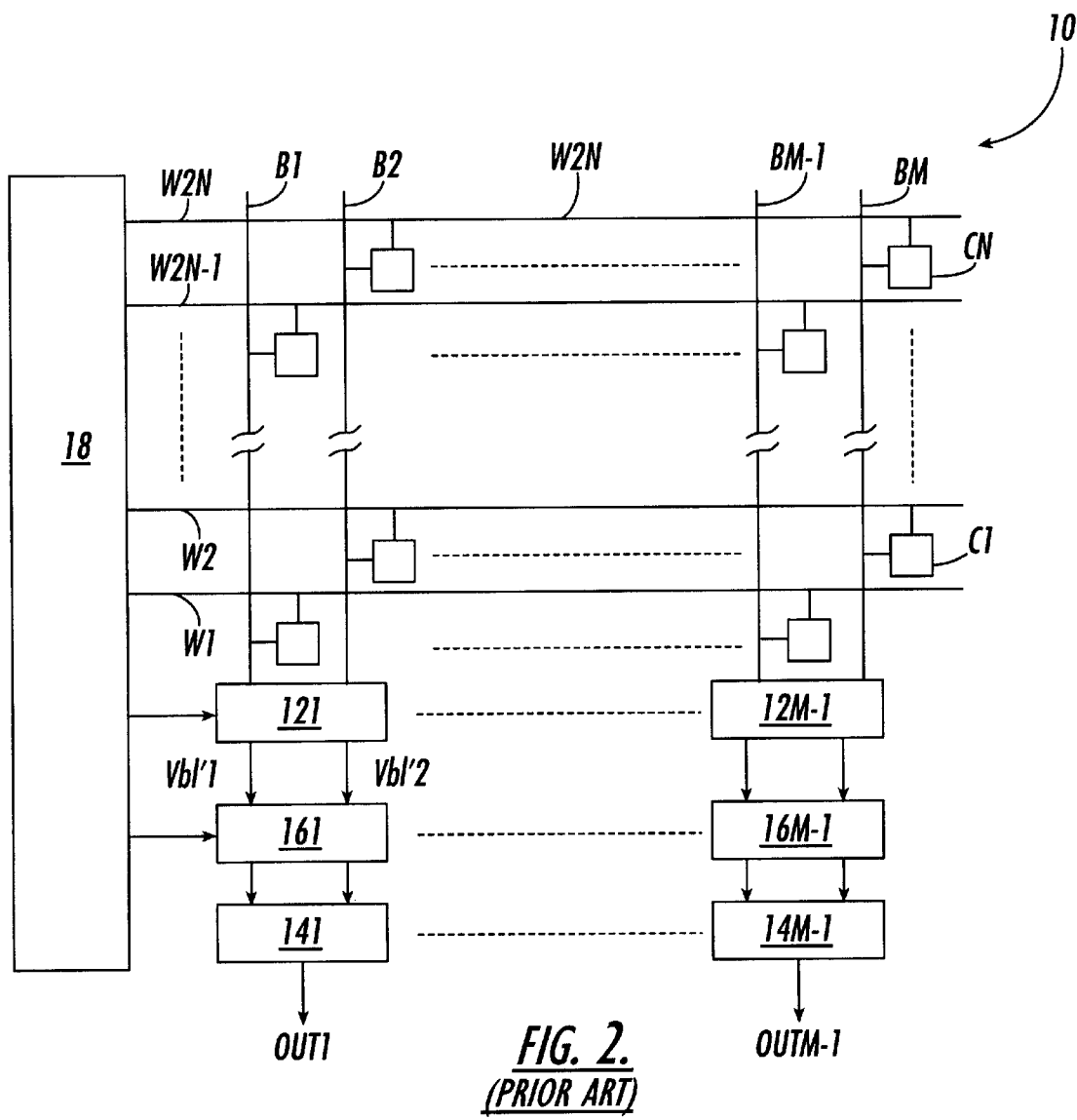
FIG. 2 gives a schematic view of a DRAM in accordance with the prior art.

FIG. 2 gives a schematic view of a DRAM 10 with a quincunxial organization. In the example described, a logic signal in the high state will have an electrical potential equal to VCC, with VCC being a supply potential of the memory. A logic signal in the low state will have an electrical potential equal to GND, with GND being a reference potential (also called a ground potential).

Figure 1:
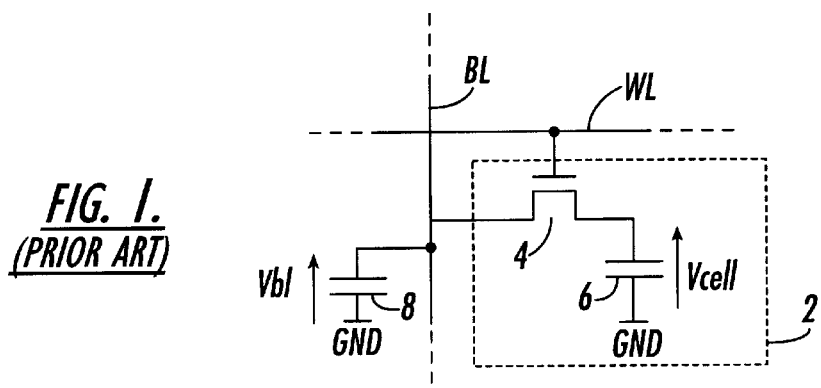
FIG. 1 shows a standard storage cell 2 of a DRAM of the prior art.

The memory is formed by M bit lines B1, B2, ..., BM and 2*N word lines W1, W2, ..., W2N-1, W2N. It will be assumed that M and N are integers and that M is an even number. Each bit line has N storage cells C1, C2, ..., CN accessible by means of N word lines. These cells are assumed to be identical to the storage cell shown in FIG. 1. The storage cells of the even-order bit lines B2, B4, ..., BM are accessible by means of even-order word lines W2, W4, ..., W2N and the storage cells of the odd-order bit lines B1, B3, ..., BM-1 are accessible by means of the odd-order word lines W1, W3, ..., W2N-1.

In an architecture of this kind, the bit lines are grouped together two by two, one being an even-order bit line and the other being an odd-order bit line. As a result, when it is sought to read the contents of a cell connected to a bit line, the associated bit line is used as a reference line. Since a given word line can be used to access only one of the two bit lines, the line used as a reference line, following the precharging, shows a stable potential memorized by the capacitor corresponding to the equivalent capacitance of this line. It will be noted that the application of the invention need not be limited to the type of architecture described. It is possible to use another type of architecture, for example, an architecture using a dedicated reference line or forming part of another plane of the memory if the memory is divided into several planes.

Figure 3:
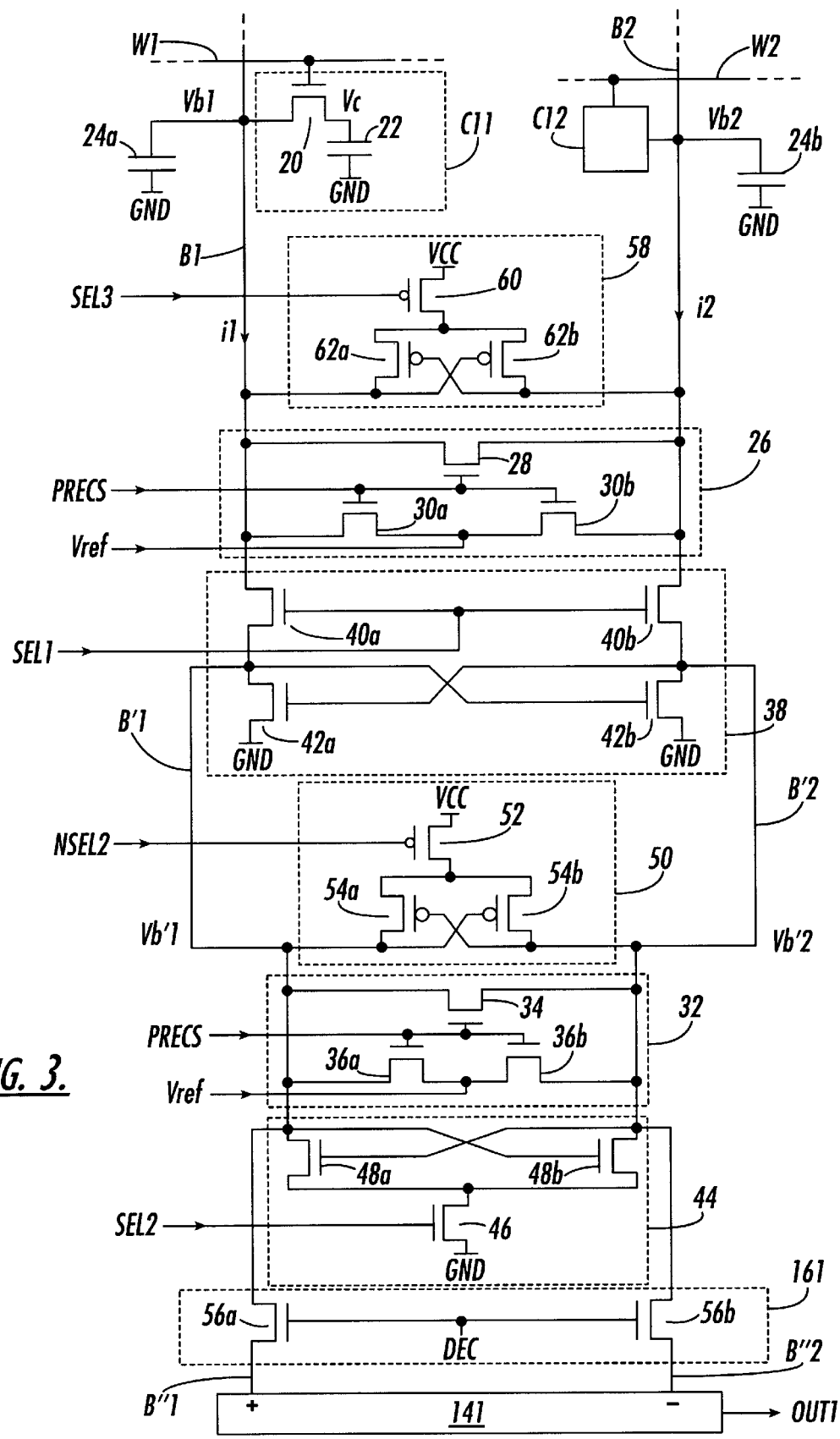
FIG. 3 shows a detailed example of a read device implementing the invention.

Each pair of bit lines (Bi, Bi+1) comprises an associated read device 12$i$, an exemplary embodiment of which is shown in FIG. 3. This device has precharging, read and refresh circuits. This device gives voltage signals Vb1'i and Vb1'i+1 to a comparator 14$i$. This comparator is used to produce an output signal OUTi when read access is obtained to the contents of one of the storage cells of the bit line Bi or the bit line Bi+1. In FIG. 2, the signals Vb1'i and Vb1'i+1 are given by means of a decoding circuit 16$i$ enabling the use of a single comparator to access several pairs of bit lines. Finally, the reading and decoding devices of the word lines are controlled by a control device 18 that gives them appropriate control logic signals to carry out the reading of the cell. It is possible, of course, to use several comparators in parallel if it is desired to access several storage cells in parallel.

FIG. 3 illustrates a detailed example of a read device according to the invention. No detailed description shall be given of the circuits of the memory 10, such as for example the making of the control device, since the making of this type of circuit will be readily understood by those skilled in the art in view of the functional description given here below. Efforts shall be made, more particularly, to describe the means and method of reading to which the invention relates.

1-Storage Cells

FIG. 3 shows two bit lines B1 and B2 known as main lines and two storage cells C11 and C12 that are accessible respectively by means of the bit lines B1 and B2 and two word lines W1 and W2. The storage cells C11 and C12 are identical to the one shown in FIG. 1.

It will be assumed, to illustrate the method of reading according to the invention, that it is desired to read the contents of the storage cell C11. The bit line B2 is then used as a reference line.

The storage cell C11 has an N channel MOS type selection transistor 20 and a storage capacitor 22. The control gate of the selection transistor 20 is connected to the word line W1. Its drain is connected to the bit line B1. Its source is connected to a first terminal of the storage capacitor 22. This capacitor has a second terminal which receives a reference potential GND (also called a ground potential). The storage cell enables the storage of a logic information element defined as a function of the voltage Vc present at the terminals of the storage capacitor 22, namely in practice as a function of the initial potential Vc of its first terminal. This initial potential, which will be modified during the read operation, represents the logic information stored. Typically, it is possible to store two logic states, a low state and a high state, depending on whether the voltage at the terminals of the capacitor is zero or not. In the former case, there will be Vc=V(0)=GND=0. In the latter case, there will be Vc=V(1) >0. It could be chosen, for example, to have V(1)=VCC.

The storage cell C12, which is not shown in detail has a structure similar to the structure of the cell C11. Furthermore, the bit lines B1 and B2 will enable access to N−1 other cells, not shown in FIG. 3.

The bit lines B1 and B2 each have an equivalent parasitic capacitance. These capacitances are substantially equal for the two bit lines, assuming of course that the bit lines have substantially identical dimensions. In FIG. 3, these parasitic capacitances are represented by parasitic capacitors 24a and 24b receiving the reference potential GND at one terminal and having another terminal connected respectively to the bit line B1 and the bit line B2. The references Vb1 and Vb2 will designate the potentials present at the bit lines B1 and B2, in other words, the voltages of the terminals of the parasitic capacitors 24a and 24b.

The reading of the information stored in the storage cell C11 comprises chiefly steps of precharging and balancing of the bit lines, the production of an output signal representing this information and the refreshing of the initial information.

2-Precharging Circuits

In the read device according to the invention, in addition to the main bit lines, bit lines B'1 and B'2 known as secondary bit lines are used. These secondary lines B'1 and B'2 are connected respectively to the main bit lines B1 and B2 by means of a current/voltage conversion circuit which acts as a read preamplifier. The production of output signals will be done on the basis of the potentials Vb'1 and Vb'2, known as secondary potentials, present at the secondary bit lines. As shall be seen hereinafter, the current/voltage conversion circuit makes it possible, firstly, to insulate the main bit lines capacitively from the secondary bit lines and, secondly, to amplify the potential difference between the main bit lines when a read operation is carried out.

The read device shown comprises a circuit 26 for the precharging of the main bit lines. This circuit 26 enables the precharging of the main bit lines, namely the positioning of the potentials Vb1 and Vb2 at a value of reference potential Vref. In practice, this reference value will be stored by the parasitic capacitors 24a and 24b and will be different from the values that can be taken by the initial potential stored in the cell C11. Typically, an intermediate reference value will be chosen between the potential values V(0) and V(1) representing states stored by the storage cells. This makes it possible to ensure times of access to a state stored in a cell that are substantially equal whatever this state may be, i.e. whether it is low or high. In the example, since we have V(1)=VCC and V(0)=GND, Vref will be chosen to be equal to VCC/2. Thus, when access is obtained to the contents of the cell of the bit line Bi, the induced modification of the potential Vbi will be symmetrical to the reference potential Vref.

The precharging device 26 also has balancing means to balance the potentials of the bit lines when they are precharged. This also makes it possible to ensure times of access, to the stored states, that are substantially equal whatever the values of the states stored. Indeed, once the bit lines B1 and B2 are precharged and a cell to be read is selected, the potential difference Vb1−Vb2 will be substantially equal in terms of absolute value whatever the modification made in the potential Vb1 or Vb2.

The circuit 26 has three transistors 28, 30a and 30b which are N channel MOS type transistors. These transistors receive a precharging control logic signal PRECS on their control gate. The positioning of this signal in the high state enables the precharging of the bit lines B1 and B2 and the balancing of the potential of these lines. The channel of the transistor 28 is mounted between the main bit lines B1 and B2 and enables their potentials to be equalized when this transistor is on. The sources of the transistors 30a and 30b are connected to each other and receive the reference potential Vref. The drains of the transistors 30a and 30b are connected respectively to the bit lines B1 and B2. These transistors enable the precharging of the main bit lines when they are on.

The read device furthermore comprises a circuit 32 for the precharging of the secondary bit lines B'1 and B'2. The circuit 32 has three N channel MOS type transistors 34, 36a and 36b. These transistors receive a control logic signal at their control gates. In the example shown, it is chosen to simultaneously precharge the main bit lines and secondary bit lines, and the received control signal is therefore the signal PRECS. It is possible, however, to use distinct precharging control signals. Since the secondary bit lines, in practice, can take lower capacitive charges than the main bit lines, it is possible, for example, to precharge them later than the main bit lines.

The channel of the transistor 34 is mounted between the secondary bit lines B'1 and B'2. This transistor enables the equalizing of the potentials of the secondary bit lines when the precharging of these lines is done. The sources of the transistors 36a and 36b are connected to each other and receive the precharging potential Vref. The drains of these transistors are connected, respectively, to the bit lines B'1 and B'2. These transistors can be used to carry the potentials of the secondary bit lines to the reference value, namely to VCC/2.

3-Read and Refresh Circuits

The read device comprises a current/voltage conversion circuit 38. This circuit 38 will be used as a read preamplifier. Furthermore, as shall be seen further below, transistors of this circuit will concurrently fulfill a filtering function between the main and secondary bit lines.

The circuit 38 has four N channel MOS type transistors 40a, 40b, 42a and 42b. The two N channel MOS type transistors 40a and 40b receive a first read control signal SEL1 at their control gates. The drain of the transistor 40a is connected to the main bit line B1 and its source is connected to a secondary bit line B'1. The drain of the transistor 40b is connected to the main bit line B2 and its source is connected to a secondary bit line B'2. To turn the transistors 40a and 40b on, it is enough, for example, to position the signal SEL1 in the high state.

The transistors 40a and 40b, called selection transistors, are used to cut the main bit lines off from the secondary bit lines during the precharging of these bit lines. As shall be seen hereinafter, these transistors are turned on to enable a discharging of the main bit lines.

The selection transistors 40a and 40b also fulfill a filtering role. It is possible that the main bit lines will be subjected to parasitic phenomena. These phenomena could take the form of pulses coming, for example, from the activation or deactivation of the transistors connected to these bit lines or again from the noise at the level of the supply and reference potentials. These phenomena may induce reading errors if the read circuits producing the output signals are subjected to these parasitic phenomena. The transistors 40a and 40b are used to filter these parasitic phenomena, if any.

Furthermore, as mentioned hereabove, the bit lines, owing to their length which is generally great, have an equivalent capacitance of about one picofarad. The use of secondary bit lines makes it possible to minimize the capacitance values perceived by the read circuits. Indeed, these secondary bit lines are connected only to the read circuits and these circuits occupy a surface area that is limited with respect to the surface area occupied by the storage cells. By decoupling the main bit lines and the read circuits from the capacitive point of view, it is therefore possible to reduce the times of access to the information elements stored in the cells.

The drain of the transistor 42a is connected, firstly, to the source of the transistor 40a and secondly to the control gate of the transistor 42b. Its source receives the reference potential GND. The drain of the transistor 42b is connected, firstly, to the source of the transistor 40b and, secondly, to the control gate of the transistor 42a. Its source receives the reference potential GND. The transistors 42a and 42b, known as conversion transistors, will be used to modulate the discharge currents i1 and i2 of the main bit lines B1 and B2 and to convert these currents into a potential difference. This potential difference is then used to produce an output signal.

The read device also has a first read and refresh circuit 44. This read and refresh circuit 44 is connected to the secondary bit lines. It enables the amplification of a difference between the secondary potentials and, more particularly, the diminishing of one of the secondary potentials by bringing it to the level of the reference potential GND. It also makes it possible to refresh the contents of the cell read when this cell has initially stored a low state. As has been mentioned, the reading of the state of a storage cell induces a modification of the voltage initially present at the terminals of its storage capacitor. It is therefore preferable to provide for a step for restoring the initial voltage during the read operation.

The circuit 44 has three N channel MOS type transistors 46, 48a and 48b. At its source, the transistor 44 receives the reference potential GND. Its control gate receives a second read control logic signal SEL2. Its drain is connected to the sources of the transistors 48a and 48b. The drain and the control gate of the transistor 48a are connected, respectively, to the bit line B'1 and to the drain of the transistor 48b. The drain and the control gate of the transistor 48b are connected, respectively, to the bit line B'2 and to the drain of the transistor 48a.

The read device also has a second read and refresh circuit 50. This circuit 50 is also connected to the secondary bit line. The circuit 50 is used to amplify a difference between the secondary potentials and, more particularly, to increase the value of one of these potentials by bringing it to the level of the supply potential VCC. It is also used to initiate the refreshing of the contents of the cell read when this cell has initially stored a high state.

The circuit 50 comprises three P channel MOS type transistors 52, 54a and 54b. The transistor 52 receives the supply potential VCC at its source. Its control gate receives a third read control logic signal NSEL2. In one example, the signal NSEL2 is obtained by inversion of the second read control signal SEL2.

The drain of the transistor 52 is connected to the sources of the transistors 54a and 54b. The drain and the control gate of the transistor 54a are connected respectively to the secondary bit line B'1 and to the drain of the transistor 54b. The drain and the control gate of the transistor 54b are connected, respectively, to the secondary bit line B'2 and to the drain of the transistor 54a. The secondary bit lines are connected to a comparator 141 by means of a decoding circuit 161.

The decoding circuit 161 is used to cut the secondary bit lines off from the read comparator 141. The presence of the circuit 161 is not strictly necessary but enables the use of the comparator 141 to read several groups of bit lines. It can also cut the comparator off from the bit lines when these bit lines are connected to write devices to store information in storage cells. The use of a decoding circuit also makes it possible to delay the production of an output signal by the comparator. It is thus possible, in the read mode, to wait for the potentials of the secondary bit lines to be set up at sufficiently distinct values, to minimize the risk of the production of an erroneous output signal.

The decoding circuit 161 has two N channel MOS type transistors 56a and 56b whose drains are connected to the lines B'1 and B'2, whose sources are connected to lines B"1 and B"2 known as output lines and whose control gates receive a selection control logic signal DEC. When the signal DEC is in the high state, the transistors 56a and 56b are on. When this signal is in the low state, the transistors are off.

The output lines B"1 and B"2 are connected to inputs of the read comparator 141, not shown in detail, which produces an output logic signal OUT1 at an output. The state of the signal OUT1 represents respective values of the secondary potentials present on the lines B"1 and B"2, namely values of the discharge currents i1 and i2 and, therefore, of the state initially memorized in the cell read. It will be assumed that the output line B"1 is connected to a+input of the comparator 141 and that the output line B"2 is connected to a—input of this comparator.

The read device finally comprises a refresh complement circuit 58. This circuit 58 is connected to the main bit lines and makes it possible, if necessary, to increase a refresh potential given by the read and precharging circuit 50.

The circuit 58 has three P channel MOS type transistors 60, 62a and 62b. The transistor 60 receives the supply potential VCC at its source. Its control gate receives a refresh control signal SEL3. Its drain is connected to the sources of the transistors 62a and 62b. The drain and the control gate of the transistor 62a are connected, respectively, to the bit line B1 and to the drain of the transistor 62b. The drain and the control gate of the transistor 62b are connected, respectively, to the bit line B2 and to the drain of the transistor 62a.

4-Reading Method Implemented

A description shall now be given of a read operation according to the invention. Reference may be made to FIGS. 4a to 4g which illustrate timing diagrams of control and potential signals during a read operation, and, more particularly, when a logic state 0 is read. FIGS. 4a, 4b, 4d, 4e and 4f respectively illustrate the signals PRECS, SEL1, SEL2, NSEL2 and SEL3. FIG. 4c illustrates the potential of the word line W1. FIG. 4g illustrates the potential Vb1, Vb2, Vb'1 and Vb'2, with Vb1 and Vb2 being the potentials of the main bit lines B1 and B2, and Vb'1 and Vb'2 being the potentials of the secondary bit lines B'1 and B'2.

It will be assumed that, initially, the main and secondary bit lines are cut off from one another and from the different circuits mentioned. There will thus be PRECS=0, SEL1=0, SEL2=0, NSEL2=1, SEL3=1 and DEC=0. The cell C11 is not selected. In other words, the word line W1 is taken to a potential such that the capacitor 22 of the cell C11 is cut off from the main bit line B1 (this potential is, for example, equal to the potential GND).

It will be recalled that it is desired to read the state stored in the cell C11, the main bit line B2 being used as a reference line. Finally, it will be assumed that the potential of the bit lines B1 and B'1 are substantially equal to the reference potential, and that the potentials of the lines B2 and B'2 are substantially equal to the potential VCC. This corresponds, as can be seen, to the result of a prior reading operation. It can also be supposed, whatever the case may be, that all these lines are discharged and have a potential substantially equal to the reference potential.

To implement a read operation, we shall first of all precharge the main and secondary bit lines in positioning the signal PRECS in the high state. The potentials of the main and secondary bit lines are taken to the value Vref=VCC/2 by the charging of the capacitors corresponding to the parasitic capacitances of these lines. The main bit lines B1 and B2 are precharged by means of the transistors 30a and 30b. The secondary bit lines B'1 and B'2 are precharged by means of the transistors 36a and 36b. The transistors 28 and 34 enable the potentials of the bit lines to be balanced with each other during the precharging operation.

Once the precharging has ended, the read operation proper can be done. It can be assumed that the precharging is ended when a given period has elapsed. Indeed, with a theoretical capacitive charge of the main and secondary bit lines being known, it is possible therefrom to deduce the theoretical period of time needed to bring the bit lines to the reference potential. It is possible also to measure the potential of the bit lines to ensure that the potentials of the lines have reached the desired reference value.

Once the precharging value has been reached, the bit lines are cut off from the precharging circuits by positioning the control signal PRECS in the low state. The potential of the bit lines is then held in the bit lines by capacitive effect.

The reading proper begins by the selection of the word line W1, in other words, by turning the transistor 20 on to access the contents of the cell. If the storage capacitor of the cell C11 is charged, then there will be a transfer of charges to the main bit line B1. The potential of this line will tend initially to increase. If this storage capacitor is not charged, there will be a transfer of charges towards the storage cell and a drop in the potential of the main bit line B1.

Then, the signal SEL1 is positioned in the high state, namely at VCC. The equivalent capacitances of the bit lines will therefore be discharged into the transistors 42a and 42b of the conversion circuit 38, with the transistors 40a and 40b being on. Indeed, since the transistors 42a and 42b are subjected to a source-gate potential difference that is substantially equal to VCC/2, they are on.

The potentials of the main bit lines will therefore tend to reach the reference value GND. To prevent an excessively rapid discharge of the main bit lines, it will be chosen to have sufficiently resistive transistors 40a and 40b whose sizes will be defined as a function of the reaction times of the read circuits and on the value of the parasitic capacitances of the main bit lines which, once they are precharged to the value Vref, form temporary current sources.

Since there is a potential difference between the main bit lines, the discharge currents i1 and i2 going through the lines B1 and B2 will be different, and a potential difference will be created on the secondary bit lines. This potential difference is then amplified by positioning the signal SEL2 in the high state and the signal NSEL2 in the low state.

We shall now consider the read and refresh operations as a function of the state initially memorized in the storage cell C11.

Reading of a Logic State 0

Let us assume that initially Vc=GND. When the transistor 20 comes on, there is a transfer of charge to the storage cell and a drop in potential Vb1 of the bit line B1. Let us assume that the transistors 40a and 40b come on.

The difference in gate-source potential of the transistor 42b will be smaller than the difference in gate-source potential of the transistor 42a. Since the positive potentials applied to the sources of these transistors 42a and 42b are identical and fixed, the transistor 42b will become more resistive than the transistor 42a. Consequently, the discharge current i1 going through the arm formed by the transistors 40a and 42a will be greater. The potential present at the drain of the transistor 42a will therefore fall at higher speed than the potential present at the drain of the transistor 42b. There will therefore be also a tendency to make the transistor 40a less resistive than the transistor 40b, thus amplifying the difference in conductivity of the arms of the circuit 38.

Thus, starting from a transient difference in voltage of about 10% in the main bit lines, there will be a tendency to create a greater difference in potential, for example, about four to five times greater, on the secondary bit lines by modulating the discharge currents i1 and i2 of the main bit lines. Shortly thereafter, the signal SEL2 will be positioned in the high state and, at the same time, the signal NSEL2 will be positioned in the low state. It is possible to change the state of the signal SEL2 as soon as the transistors 40a and 40b come on. However, it is preferable to delay the reading slightly to prevent erroneous reading, as the potential difference between the secondary bit lines is small at the beginning of the discharging of the main bit lines. When the signals SEL2 and NSEL2 are respectively in the high state and the low state, the transistors 46 and 52 turn on.

The read circuit 44 will amplify the potential difference between the secondary bit lines by taking the value of the secondary potential Vb'1 to GND. Since the secondary bit line B'2 is at a secondary potential Vb'2 higher than the line B'1, the potential Vb'1 present at the drain of the transistor 48a will drop at higher speed than the potential Vb'2 present at the drain of the transistor 48b.

Consequently, the potential Vb'1 of the secondary bit line B'1 will be brought to the potential GND through transistors 48a and 46. This will lead to an increase in the resistivity of the transistor 48b.

At the same time, since the signal NSEL2 is in the low state, the transistors 54a and 54b receive the supply potential VCC at their sources. Since the difference in gate-source potential of the transistor 54b is greater than that of the transistor 54a, the potential Vb'2 of the secondary reference bit line B'2 will increase to reach the value of VCC. At the same time, the transistor 54a will go off, thus holding the potential of the secondary bit line B'1 at the potential GND. The circuit 50 thus makes it possible to amplify the difference in potential between the secondary bit lines, by bringing the potential Vb'2 to the level of VCC.

By positioning the signal DEC in the high state, the transistors 56a and 56b will be made to come on. The comparator 141 then receives, at its inputs, the secondary potentials of the lines B'1 and B'2 and will produce an output signal OUT1 whose state will represent the initial state of the cell C11. If we assume that the line B"1 is connected to the +input of the comparator, this input being supplied by the potentials VCC and GND, the signal OUT1 will be in the low state.

When a logic state 0 is read, it will be observed that the refreshing of the contents of the cell C11 is done at the same time as the read operation. The read operation will be performed in effect by the discharging of the main bit line B1 and of the storage capacitor 22. If the implementation of the read operation is accompanied initially by an increase in the voltage at the terminals of the storage capacitor, this increase being due to the transfer of charges to the storage cell, it is followed by a drop in this voltage once the voltages are balanced on the bit line and at the terminals of the capacitor. Then the bit line B1 and the storage capacitor 22 are discharged simultaneously. It will be observed that the circuit 44 makes it possible to increase the potential of the control gate of the transistor 42a and carry it to the value of VCC. If we assume that the memory is supplied solely by the potentials VCC and GND, it is then ensured that there is a maximum gate-source potential difference for the transistors 40a and 42a whose channels are series-connected between the first terminal of the storage capacitor 22 and the ground. These transistors are therefore as conductive as possible, making it possible to ensure a minimum refresh period. In the case of the reading of a logic state 0, the method according to the invention enables a reduction in the duration of reading and the duration of refreshing.

Reading of a Logic State 1

Let us assume that we have initially Vc=VCC. As hereabove, the main bit lines are discharged through transistors of the circuit 38. The potentials Vb1 and Vb2 of these bit lines will therefore drop at varying speeds depending on the resistivity of the transistors of the circuit 38.

When the word line W1 is selected, there is a transfer of charge from the storage cell C11 to the bit line B1. This transfer of charge is accompanied by a temporary increase in potential Vb1 of this bit line. When the transistors 40a and 40b come on, the difference in gate-source potential is then greater for the transistor 42b than it is for the transistor 42a. The transistor 42b will therefore become less resistive than the transistor 42a. The discharge current i2 will therefore be greater. Consequently, the potentials of the bit lines B2 and B'2 will drop, to reach the potential GND, at higher speed than the potentials of the bit lines B1 and B'1.

When the transistors 46 and 52 come on, the transistor 48a receives a lower potential, at its control gate, than does the transistor 48b. The transistor 48a is then more resistive than the transistor 48b. The difference in potential Vb'1–Vb'2 between the secondary bit lines is then amplified by bringing the potential Vb'2 to the level of the potential GND.

As noted hereabove, the difference in potential between the lines B'1 and B'2 will be amplified by the circuit 50. The potential Vb'1 of the bit line B'1 will reach the value of VCC by means of the transistor 54a. The transistor 54b for its part will go off.

By positioning the signal DEC in the high state, the transistors 56a and 56b will be made to come on. The comparator 141 then receives the secondary potentials Vb'1 and Vb'2 at its inputs and produces an output logic signal OUT1 whose high state represents the initial state of the cell C11.

Together with the acceleration of the read operation, the circuit 50 will take part in the refreshing of the contents of the cell C11, namely the restoring of the initial potential memorized in the cell. This refreshing is greater as the read operation according to the invention is destructive. Indeed, when the transistor 40a is turned on, there will be a discharging of the bit line and of the storage capacitor. This was not the case in the prior art circuits.

The transistors 52 and 54a, apart from the fact that they amplify the initial potential difference of the secondary bit lines by giving the potential VCC to an input of the comparator 141, also give this potential to the bit line B1 through the transistor 40a. Thus, the storage capacitor 22 will be recharged so that the potential of its first terminal rises to the value of VCC.

In reality, it is necessary to take into account the drop in voltage in the channel of the transistor 40a. A first approach designed to account for this problem lies in carrying the control signal SEL1 to a potential that is sufficient to cancel out this drop in voltage. If it is desired to make a memory supplied solely by means of the potentials VCC and GND, this implies making provision for voltage-raising circuit which entails penalties in terms of the amount of surface area occupied. In the example shown, the circuit 58 is used to finish the refreshing of the contents of the cell C11 by means of its transistors 60 and 62a. It is therefore not necessary to produce a potential greater than VCC.

The refreshing complement is activated by positioning the signal SEL3 in the low state. The transistor 60 comes on and the transistors 62a and 62b receive the potential VCC at their source. The potentials received by the gates of these transistors are out of balance. The transistor 62a has a difference in gate-source potential that is greater. It is therefore more conductive than the transistor 62b. Consequently, the potential VCC will become the potential at the drain of the transistor 62a and the transistor 62b will go off. The potential of the line B1 will then rise to VCC by means of the transistors 60 and 62a, and finish the refresh operation initialized by the read circuit 50. It will be observed that it is possible to do without the read circuit 50. The circuit 44 will then be used for the reading and the circuit 58 will be used for the refreshing. This makes it possible to reduce the surface area taken up by the read and refresh devices. In contrast, the example illustrated has an advantage in terms of speed since the circuit 50 makes it possible, in the read mode, to obtain the benefit of a greater difference in potential at the inputs of the comparator 141.

In practice, for the reading of a logic state 1, the reading and refreshing are differentiated. It is possible to obtain faster reading in a manner similar to that described for the reading of a logic state 0. In contrast, given the discharging of the bit line and the storage capacitor through the transistors 40a and 42b, a slightly slower refresh operation will be carried out, all other things being equal.

If it is desired to read the contents of a storage cell attached to the main bit line B2, the method implemented will be identical. The main bit line B1 will then be used as a reference line. The only difference with the example given in detail will be the value of the signal OUT1 as a function of the state stored in the cell read. Indeed, if the cell read initially stored a state 0, then there would be OUT1=VCC. If it stored a state 1, then there would be OUT1=GND. To harmonize the value of the output signal produced by the comparator 141, an additional circuit could be used to invert the output signal produced if the contents of the cell attached to an even-order bit line are read and, if not, to refrain from inverting it.

It will be noted that the chronology of the control signals can be modified. In the example described, the selection of the cell precedes the discharging of the bit lines. It is possible, however, to work differently and begin by discharging the bit lines before the cell is selected. This selection should of course be done at high speed. The modulation of the discharge currents implies, indeed, that these currents have non-zero values, i.e. that the lines are not already discharged. It is also possible to carry out the selection and the control of the discharge operation simultaneously.

That which is claimed is:

1. A method for reading a dynamic memory comprising at least one bit line, at least one word line, at least one storage cell accessible by the bit line and the word line, and at least one reference line, the storage cell enabling the storage of an initial potential representing a logic information element, the method comprising the steps of:

precharging the bit line and the reference line to change potentials thereof to a level of a reference potential that is different from the initial potential stored in the storage cell;

selecting the storage cell to produce a change of the potential of the bit line and thus create an initial difference between the potentials of the bit line and the reference line;

discharging the bit line and the reference line so that the bit and reference lines are then crossed by discharge currents; and producing an output signal having a state representing values of the discharge currents.

2. A method according to claim 1, further comprising the step of controlling the values of the discharge currents as a function of the values of the potentials of the bit line and the reference line, in a direction tending to increase the initial difference therebetween.

3. A method according to claim 1, further comprising the steps of:

converting the discharge currents of the bit line and the reference line into a first secondary potential and a second secondary potential with values representing respective values of the potentials of the bit line and of the reference line; and comparing the first and second secondary potentials to produce the output signal.

4. A method according to claim 3, further comprising the step of amplifying the values of the first secondary potential and the second secondary potential.

5. A method according to claim 4, further comprising the step of using the secondary potentials to control an increase in the values of the discharge currents so as to amplify the initial difference in potential between the bit line and the reference line.

6. A method according to claim 4, wherein the memory is supplied by a supply potential and by a reference potential, and wherein the step of amplifying comprises bringing one of the secondary potentials to a level of the supply potential and the other secondary potential to a level of the reference potential.

7. A method according to claim 6, wherein the initial value of the initial potential stored in the storage cell is substantially equal to the value of the supply potential or to the value of the reference potential, and wherein the method comprises the step of restoring the initial value of the stored initial potential when this initial value is substantially equal to the value of the supply potential, wherein said step of restoring is initiated by amplifying the first secondary potential and is finished by changing the value of the potential of the bit line to the value of the supply potential.

8. A method for reading a dynamic memory comprising at least one bit line, at least one word line, at least one storage cell accessible by the bit line and the word line, and at least one reference line, the storage cell enabling the storage of an initial potential representing a logic information element, the method comprising the steps of:

precharging the bit line and the reference line to change potentials thereof to a level of a reference potential that is different from the initial potential stored in the storage cell;

selecting the storage cell to produce a change of the potential of the bit line and thus create an initial difference between the potentials of the bit line and the reference line; and discharging the bit line and the reference line so that the bit and reference lines carry respective discharge currents to produce an output signal based upon the discharge currents.

9. A method according to claim 8, further comprising the step of controlling the values of the discharge currents as a function of the values of the potentials of the bit line and the reference line, in a direction tending to increase the initial difference therebetween.

10. A method according to claim 8, further comprising the steps of:

converting the discharge currents of the bit line and the reference line into a first secondary potential and a second secondary potential with values representing respective values of the potentials of the bit line and of the reference line; and comparing the first and second secondary potentials to produce the output signal.

11. A method according to claim 10, further comprising the step of amplifying the values of the first secondary potential and the second secondary potential.

12. A method according to claim 11, further comprising the step of using the secondary potentials to control an increase in the values of the discharge currents so as to amplify the initial difference in potential between the bit line and the reference line.

13. A method according to claim 11, wherein the memory is supplied by a supply potential and by a reference potential, and wherein the step of amplifying comprises bringing one of the secondary potentials to a level of the supply potential and the other secondary potential to a level of the reference potential.

14. A method according to claim 13, wherein the initial value of the initial potential stored in the storage cell is substantially equal to the value of the supply potential or to the value of the reference potential, and wherein the method comprises the step of restoring the initial value of the stored initial potential when this initial value is substantially equal to the value of the supply potential, wherein said step of restoring is initiated by amplifying the first secondary potential and is finished by changing the value of the potential of the bit line to the value of the supply potential.

15. A dynamic memory comprising:
   at least one bit line;
   at least one word line;
   at least one storage cell to store an initial potential representing a logic information element and being accessible by the at least one bit line and the at least one word line;
   at least one reference line;
   means to precharge a desired bit line and a desired reference line to change potentials thereof to a reference value during a precharging phase; and
   reading means for producing, during a reading phase, an output signal representing the initial potential stored in a desired storage cell, said reading means comprising discharge means for discharging the desired bit line and the desired reference line during the reading phase so that the desired bit line and the desired reference line carry respective first and second discharge currents and the output signal is based upon the first and second discharge currents.

16. A dynamic memory according to claim 15, wherein the at least one reference line comprises a bit line.

17. A dynamic memory according to claim 15, wherein said reading means further comprises means to control the values of the discharge currents as a function of the values of the potentials of the desired bit line and the desired reference line in a direction tending to increase an initial difference between the values of the potentials.

18. A dynamic memory according to claim 15, wherein said reading means comprises:
   conversion means for converting the first discharge current of the desired bit line into a first secondary potential and to convert the second discharge current of the desired reference line into a second secondary potential; and
   a comparator receiving the first and second secondary potentials and producing the output signal.

19. A dynamic memory according to claim 18, wherein said conversion means comprises a current-voltage conversion circuit comprising:
   a first arm comprising a first selection transistor and a first conversion transistor series-connected with the bit line, the first selection transistor for activating the discharging of the bit line and the first conversion transistor for producing the first secondary potential when the first selection transistor is on; and
   a second arm comprising a second selection transistor and a second conversion transistor series-connected with the reference line, the second selection transistor for activating the discharging of the reference line and the second conversion transistor for producing the second secondary potential when the second selection transistor is on.

20. A dynamic memory according to claim 19, wherein, for each arm of the current-voltage conversion circuit, a conversion transistor of one arm has a control gate connected to the drain of a conversion transistor of the other arm so that a change of the potential appearing at the bit line during a transfer of charges between the storage cell and the bit line induces a change of resistivity of the conversion transistor of the other arm and, therefore, a change in an opposite direction of resistivity of the conversion transistor of the one arm.

21. A dynamic memory according to claim 20, further comprising a first read circuit to amplify a potential difference between the first and second secondary potentials by reducing the value of one of the first and second secondary potentials.

22. A dynamic memory according to claim 21, further comprising a second read circuit to amplify a potential difference between the first and second secondary potentials by increasing the value of one of the first and second secondary potentials.

23. A dynamic memory according to claim 22, wherein the memory is supplied by a supply potential and by a reference potential; the initial value of the initial potential stored in the storage cell is substantially equal to the value of the supply potential or to the value of the reference potential; wherein the reading phase further comprises restoring the initial value of the initial potential stored when this initial value is substantially equal to the value of the supply potential; wherein the restoring of the initial value is achieved by the second read circuit through the first selection transistor of the current-voltage conversion circuit; and wherein the memory further comprises a complementary precharging circuit to change the value of the potential of the bit line to a level of the value of the supply potential to finish the restoring.

24. A dynamic memory comprising:
   at least one bit line;
   at least one word line;
   at least one storage cell to store an initial potential representing a logic information element and being accessible by the at least one bit line and the at least one word line;
   at least one reference line;
   means to precharge a desired bit line and a desired reference line to change potentials thereof to a reference value during a precharging phase; and
   a reading circuit for discharging the desired bit line and the desired reference line during a reading phase so that the desired bit line and the desired reference line carry respective first and second discharge currents for producing an output signal representing the initial potential stored in a desired storage cell based upon the first and second discharge currents.

25. A dynamic memory according to claim 24, wherein the at least one reference line comprises a bit line.

26. A dynamic memory according to claim 24, wherein said reading circuit further comprises means to control the values of the first and second discharge currents as a function of the values of the potentials of the desired bit line and the desired reference line in a direction tending to increase an initial difference between the values of the potentials.

27. A dynamic memory according to claim 24, wherein said reading circuit further comprises:
   conversion means for converting the first discharge current of the desired bit line into a first secondary potential and to convert the second discharge current of the desired reference line into a second secondary potential; and
   a comparator receiving the first and second secondary potentials and producing the output signal.

28. A dynamic memory according to claim 22, further comprising a current-voltage conversion circuit comprising:
   a first arm comprising a first selection transistor and a first conversion transistor series-connected with the bit line, the first selection transistor for activating the discharging of the bit line and the first conversion transistor for producing the first secondary potential when the first selection transistor is on; and a second arm comprising a second selection transistor and a second conversion transistor series-connected with the reference line, the second selection transistor for activating the discharging of the reference line and the second conversion transistor for producing the second secondary potential when the second selection transistor is on.

29. A dynamic memory according to claim 28, wherein, for each arm of the current-voltage conversion circuit, a conversion transistor of one arm has a control gate connected to the drain of a conversion transistor of the other arm so that a change of the potential appearing at the bit line during a transfer of charges between the storage cell and the bit line induces a change of resistivity of the conversion transistor of the other arm and, therefore, a change in an opposite direction of resistivity of the conversion transistor of the one arm.

30. A dynamic memory according to claim 29, further comprising a first read circuit to amplify a potential difference between the first and second secondary potentials by reducing the value of one of the first and second secondary potentials.

31. A dynamic memory according to claim 30, further comprising a second read circuit to amplify a potential difference between the first and second secondary potentials by increasing the value of one of the first and second secondary potentials.

32. A dynamic memory according to claim 31, wherein the memory is supplied by a supply potential and by a reference potential; wherein the initial value of the initial potential stored in the storage cell is substantially equal to the value of the supply potential or to the value of the reference potential; wherein the reading phase further comprises restoring the initial value of the initial potential stored when this initial value is substantially equal to the value of the supply potential; wherein the restoring of the initial value is achieved by the second read circuit through the first selection transistor of the current-voltage conversion circuit; and wherein the memory further comprises a complementary precharging circuit to change the value of the potential of the bit line to a level of the value of the supply potential to finish the restoring.

* * * * *